United States Patent
Mallinson

(10) Patent No.: US 11,750,970 B2
(45) Date of Patent: Sep. 5, 2023

(54) METHOD AND APPARATUS FOR RECOVERING BACK-EMF SIGNAL IN A SWITCHING DRIVER

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 242 days.

(21) Appl. No.: 17/372,440

(22) Filed: Jul. 10, 2021

(65) Prior Publication Data

US 2022/0014848 A1 Jan. 13, 2022

Related U.S. Application Data

(60) Provisional application No. 63/051,039, filed on Jul. 13, 2020.

(51) Int. Cl.
*H03F 3/20* (2006.01)
*H04R 3/00* (2006.01)
(Continued)

(52) U.S. Cl.
CPC ............ *H04R 3/00* (2013.01); *G01H 11/08* (2013.01); *H03F 3/20* (2013.01); *H03K 5/24* (2013.01);
(Continued)

(58) Field of Classification Search
CPC ........ H04R 3/00; H04R 2420/03; H04R 3/02; G01H 11/08; H03F 3/20; H03F 2200/03;
(Continued)

(56) References Cited

U.S. PATENT DOCUMENTS 6,870,934 B2 * 3/2005 Krochmal ............ H04R 29/001
    381/59
7,576,939 B2 * 8/2009 Ooi ..................... G11B 5/59605
    318/494

(Continued)

OTHER PUBLICATIONS

"Telephone hybrid," Wikipedia, Dec. 11, 2020, "https://en.wikipedia.org/w/index.php?title=Telephone_hybrid&oldid=993646368".
(Continued)

*Primary Examiner* — Hieu P Nguyen
(74) *Attorney, Agent, or Firm* — Gard & Kaslow LLP

(57) ABSTRACT

An apparatus and method for determining signals representative of events in the environment of a reactive transducer while being driven by a switching amplifier is disclosed. While the switching amplifier is in a zero voltage state, a signal capture circuit that is also in a zero voltage state is connected to the transducer for a relatively brief period of time during which a measurement is made of the residual current flow due to the inductance of the transducer. A prediction of the output signal is then subtracted from the signal measured across the transducer, reducing the overall range of the signal and increasing the relative size of the back-EMF signal compared to any remaining output signal. If desired, conventional echo cancellation can then be performed. The back-EMF signal can then be subjected to further processing by an analog-to-digital converter as known in the art.

17 Claims, 6 Drawing Sheets

(51) Int. Cl.
*H03K 5/24* (2006.01)
*G01H 11/08* (2006.01)

(52) U.S. Cl.
CPC ...... *H03F 2200/03* (2013.01); *H04R 2420/03* (2013.01)

(58) Field of Classification Search
CPC ......... H03F 3/187; H03F 3/2173; H03K 5/24; B06B 1/0292
USPC .................................. 330/9–10, 251, 207 A
See application file for complete search history.

(56) References Cited

U.S. PATENT DOCUMENTS 10,433,046 B2    10/2019  Mallinson et al.
10,798,479 B2 *  10/2020  Mallinson ............ H04R 1/1083

OTHER PUBLICATIONS

"Motor drive," Wikipedia, Dec. 17, 2020, "https://en.wikipedia.org/w/index.php?title=Motor_drive&oldid=994686431".
"Counter-electromotive force", Wikipedia, Dec. 27, 2020, "https://en.wikipedia.org/w/index.php?title=Counter-electromotive_force&oldid=996527868".

* cited by examiner

METHOD AND APPARATUS FOR RECOVERING BACK-EMF SIGNAL IN A SWITCHING DRIVER

This application claims priority from Provisional Application No. 63/051,039, filed Jul. 13, 2020, which is incorporated by reference herein in its entirety.

FIELD OF THE INVENTION

The present invention relates generally to switching drivers, and more particularly to recovering a back-EMF signal generated by a transducer receiving a driving signal from a switching driver.

BACKGROUND OF THE INVENTION

It is known in the art that a transducer that produces sound in response to an audio signal, such as the transducer in an earpiece or a loudspeaker, does so by moving in response to the audio signal applied to it and thus producing a sound corresponding to the audio signal. As is also known in the art, the process works in reverse as well; when such a transducer is subjected to an external sound, it in turn produces an electrical signal, a back Electromotive Force or "back-EMF" signal, although this signal will typically be orders of magnitude smaller than the signal that is used to drive the transducer.

In the typical case, when the transducer is driven to make a sound, the driving means generates a voltage across the transducer terminals, and a current then flows in the transducer that is largely determined by that voltage across the impedance of the speaker. However, while the current in the transducer is largely due to the driving voltage, it is also influenced by the back-EMF signal caused by the external sounds in the environment. If the current flow can be measured with sufficient accuracy and the current component due to the driving signal removed, only the back-EMF signal from the transducer will be left, which may then be considered as an input signal distinct from the output signal fed to the transducer.

In this case the transducer can simultaneously operate as an output and an input device. This can be particularly useful in audio systems where, for example, an earbud may play music to the user and pick up the user's voice at the same time. If the driving signal can be separated from that created by the external sound then full-duplex operation is possible, meaning output and input can occur at the same time (as opposed to connecting the transducer as just an output device or just an input device, or having them operate as such at different points in time, which would be half-duplex).

The challenge in such a device is to separate the large driving signal from the small back-EMF signal caused by the external sound.

There are some known ways to achieve separation of the output signal from a back-EMF input signal. Examples in audio systems include the echo cancellation implemented in Voice over IP {VoIP} communications and the loudspeaker mode in cellphones. Echo cancellation works by correlating the incoming signal from the transducer with the known outgoing signal. An outgoing signal is modified in terms of delay and frequency response and inverted in phase, and is then added to cancel a predicted portion of the signal picked up by the transducer, theoretically leaving only the voice input.

However, while this technique is well known in the art and is sufficient for echo cancellation, there are issues in using an equivalent technique to allow a transducer to operate in a full-duplex mode. One issue is how to determine the small back-EMF signal. If the transducer is driven with a voltage signal, then the current flow due to the back-EMF signal must be measured with sufficient accuracy. U.S. Pat. No. 10,433,046 shows one way to achieve this, and U.S. Pat. No. 10,652,649 shows another. Key to both of these patents is the ability to remove a first order prediction of the current from the actual current flowing in the transducer due to the driving signal. The '046 patent accomplishes this by use of matching impedance, while the '649 patent uses a more sophisticated and adaptive prediction.

In both the '046 and '649 patents, the current that flows in the transducer as a result of the driving voltage is measured: this current has a predictable component due to that driving voltage, and an unpredictable component due to the back-EMF created by the environment of the transducer. The removal of the predictable component leaves the unpredictable component of the back-EMF and this represents the concurrent microphone action (or similar environmental effect) that may be recovered in full-duplex mode.

A second issue is how to deal with the large dynamic range of the signals. In the '046 and '649 patents, the prediction of the current is also necessary to reduce the large dynamic range of an audio signal to a smaller range needed to effect echo cancellation or operate in a full duplex mode. For example, the magnitude of the driving signal in a typical configuration of an audio earbud transducer is about 100 millivolts (mV), while the magnitude of the back-EMF due to the external environment is about 1-2 microvolts (uV), or about 100,000 times smaller, and the range of an analog-to-digital converter (ADC) is typically about 10 mV.

If a 1 uV signal is to be measured to, for example, a signal-to-noise (S/N) ratio of 60 decibels (dB) or about 1 nanovolt (nV), a further factor of 1000, then the 100 mV driving signal must be measured to about 1 part in 100,000,000, or 160 db of dynamic range; this is beyond the capability of present day ADCs. (Decibels here refer to power, not amplitude; thus, a 20 dB increase represents a change of 10 times the power.)

However, if a prediction of the signal due to the output can be made to within, for example, 60 db of precision (i.e., 1 part in 1000), then an analog subtraction circuit may suppress the 100 mV applied to the transducer to 100 uV. Now the ADC must measure 1 nV on a signal of 100 uV or about 100 dB of performance, which is within the ability of currently available ADC devices. Such an analog subtraction circuit is an analog "hybrid," a device that suppresses the output signal, and a good ADC in combination with such a circuit can achieve full-duplex in the speaker-as-microphone example discussed here, as taught in the '046 and '649 patents.

It will be apparent that in the echo cancellation and full duplex operation devices described above the signal across the transducer is an applied voltage from an amplifier that is entirely or partly linear in operation and that creates a continuous representation of the input signal, for example, a class A, B, AB or C amplifier. This applied voltage results in inefficiency, i.e., power being dissipated, i.e., wasted, when it is not needed to actually drive the transducer.

In contrast, a switching amplifier, such as a class D, E, F, G, S, T, etc. amplifier, is entirely non-linear and does not create a continuous representation of the signal, but rather remains fixed at certain well defined and discrete levels, using discrete switching to generate the output waveform, and thus operates with a much higher efficiency. A switching amplifier is designed to not generate a voltage due to the current flow in the transducer, as this implies unwanted power dissipation. Thus, in theory, a switching amplifier can approach nominally zero power dissipation and thus 100 percent efficiency in delivering power to the load, i.e. in driving the transducer. Battery life in applications using class D or similar switching amplifiers is therefore significantly improved and there is considerable commercial demand for such devices.

However, such switching amplifiers are unable to provide for a current measurement, which is needed for full-duplex operation as described above, because the output impedance of a switching amplifier is very low and any attempt to insert a resistance across which a voltage representing the current could be measured would significantly reduce the efficiency of the switching amplifier.

For example, a switching amplifier with an output impedance of 0.1 ohm driving a load of 16 ohms is quite efficient (since 0.1 is a small fraction of 16) but any attempt to measure current flowing in the load across that 0.1 ohm output impedance would result in a very small signal. The back EMF voltage may be 10 uV so only 10 uV/160 or about 60 nV would be generated across the 0.1 ohm. If this is to be measured to 1 part in 1000 the system must be able to measure 60 picovolts (pV). This is far beyond the capability of even the highest performance low noise amplifier currently available. Consequently, in the known art there is no convenient means to measure the current flowing in the load of a switching amplifier without compromising the efficiency of the switching amplifier.

SUMMARY OF THE INVENTION

Described herein is an apparatus and method for determining a signal representative of the effect of an external event on a transducer being driven by a switching amplifier.

One embodiment describes a method of determining a signal representative of the effect of external sound on a transducer being driven by an output signal from a switching amplifier having a zero voltage state, the transducer having a reactance that causes a current to continue to flow momentarily in the transducer when the output signal ceases, comprising the steps of: disconnecting the transducer from the switching amplifier during an occurrence of the zero voltage state for a period of time shorter than a duration of the zero voltage state; connecting a signal capture circuit around the transducer and measuring a current in the signal capture circuit during the period of time in which the transducer is disconnected from the switching amplifier, thereby capturing a signal caused by the inductance of the transducer, the captured signal containing both the output signal and the signal representative of external sound; and generating a modified captured signal containing the signal representative of external sound by removing a prediction of the output signal from the captured signal.

Another embodiment describes a method of determining a signal representative of an effect of an environmental event on a motor being driven by an output signal from a switching amplifier having a zero voltage state, the motor having a reactance that causes a current to continue to flow momentarily in the motor when the output signal ceases, comprising the steps of: disconnecting the motor from the switching amplifier during an occurrence of the zero voltage state for a periods of time shorter than a duration of the zero voltage state; connecting a signal capture circuit around the motor and measuring a current in the signal capture circuit during the period of time in which the transducer is disconnected from the switching amplifier, thereby capturing a signal caused by the inductance of the motor, the captured signal containing both the output signal and the signal representative of the environmental event; generating a modified captured signal containing the signal representative of the environmental event by removing a prediction of the output signal from the captured signal.

Still another embodiment discloses a circuit for determining a signal representative of the effect of external sound on a transducer being driven by a current representing an output signal from a switching amplifier, the switching amplifier having a zero voltage state and comprising one or more switches each having two states, a first state configured to allow current to flow to the transducer and a second state configured to prevent current from flowing to the transducer, and the transducer having a reactance that causes a current to continue to flow momentarily in the transducer when the driving current ceases, the circuit comprising: a signal capture circuit configured to capture a signal caused by the inductance of the transducer and having a first end configured to be connected to a first end of the transducer and a second end configured to be connected to a second end of the transducer; control logic configured to generate a first switching signal causing the states of the one or more switches in the switching amplifier to change during a portion of a zero voltage state, thereby preventing current from flowing from the switching amplifier to the transducer, and a second switching signal causing the signal capture circuit to be connected to the transducer for the portion of the zero voltage state; a comparison circuit configured to receive the captured signal and a prediction of the output signal and to generate a modified captured signal containing the signal representative of external sound by removing the prediction of the output signal from the captured signal.

Yet another embodiment discloses a method of determining a signal representative of an effect of an environmental event on a transducer being driven by an output signal from a switching amplifier having a zero voltage state, the transducer having a reactance that causes a current to continue to flow momentarily in the transducer when the output signal ceases, comprising the steps of: disconnecting the transducer from the switching amplifier during an occurrence of the zero voltage state for a period of time shorter than a duration of the zero voltage state; connecting a signal capture circuit around the transducer and measuring a current in the signal capture circuit during the period of time in which the transducer is disconnected from the switching amplifier, thereby capturing a signal caused by the inductance of the transducer, the captured signal containing both the output signal and the signal representative of the environmental event; and generating a modified captured signal containing the signal representative of the environmental event by removing a prediction of the output signal from the captured signal.

DETAILED DESCRIPTION OF THE INVENTION

Figure 2:
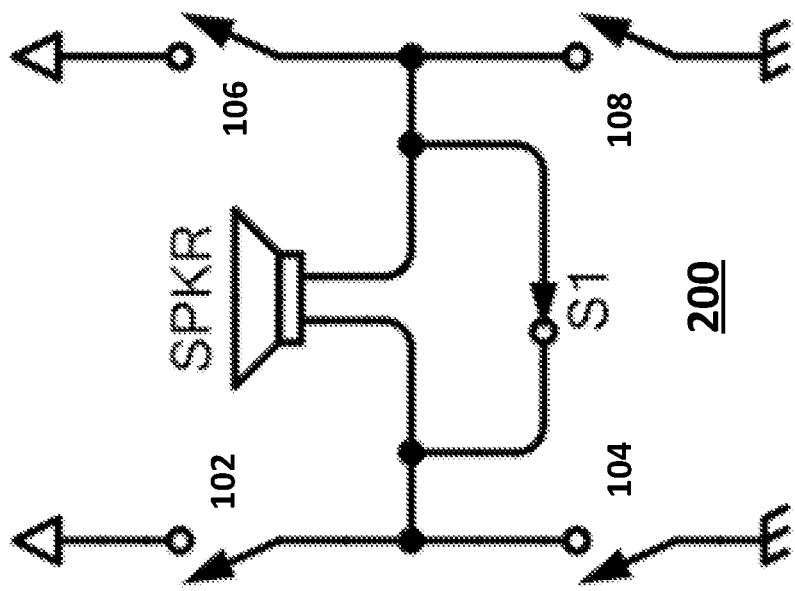
FIG. 2 is a diagram of a typical transducer connected in a bridge of four switches with an additional switch to short the transducer according to one embodiment of the present approach.

Described herein is a method and apparatus for determining a signal representative of the effect of an external event (e.g., sound) or an environmental event on a transducer being driven by a switching amplifier.

It is possible to measure a back-EMF signal caused by external sound when a discrete level, non-continuous class D or similar form of switching amplifier is used with a transducer that has inductance, i.e., the tendency for the transducer to cause an electromotive force when the current in the transducer changes. The output signal across the transducer, while the signal is in a state of nominally zero volts, is briefly interrupted for short periods of time during which measurements are made of the residual current flow due to the inductance of the transducer. The residual current flow includes the effect of the back-EMF on the transducer. Since the measurement state is also a zero voltage state, the signal received by the transducer does not change, and there is thus no effect on the output signal from the switching amplifier that is seen by the transducer.

In a half-duplex mode of the prior art, the transducer is not simultaneously receiving an output signal from the amplifier while it generates the back-EMF signal from the external sound (or other effect) impinging upon it; rather, the output signal from the amplifier is either paused or disconnected so that the transducer does not receive any output signal at all, to allow the transducer to generate the back-EMF signal. By contrast, in the present approach, the transducer is temporarily disconnected during a zero voltage state of the switching amplifier, but the transducer continues to receive a voltage of zero without pause. The transducer thus continues to produce audio while the back-EMF signal is generated, and thus the transducer operates in a "full duplex equivalent" mode and performs as if it is in a true full duplex mode.

A prediction of the output signal is then subtracted from the combined output signal and back-EMF signal measured across the transducer, reducing the overall range of the signal and increasing the relative size of the back-EMF signal compared to any remaining output signal. If desired in a given implementation, conventional echo cancellation may then be performed. The back-EMF signal may then be subjected to further processing by an analog-to-digital converter as known in the art.

While the discussion herein focuses primarily on back-EMF signals caused by sound, use of the present approach is not limited to sound applications. In some embodiments, the present approach may be used to determine back-EMF signals representative of external events or environmental effects other than sound. For example, some motion activities of a user, and some biological functions, will also produce a sound pressure wave that will cause an electroacoustic transducer to produce a back-EMF audio signal in response to the particular physical activity that is occurring, even when the sound pressure wave from the activity may be inaudible to the human ear. In some embodiments the determined back-EMF signal may be representative of a user's heart rate and/or characteristics of the user's heart beat, whether and how the user is walking, whether the user has swallowed, or whether the user has tapped on the transducer (e.g., with a finger). In still other embodiments, the determined back-EMF signals may be representative of other motion artifacts, or representative of other environmental effects external to the transducer including, for example, pressure, temperature, humidity, and the application of a physical force.

As above, a switching driver, such as a class D amplifier or a derivative of the same, is characterized as using discrete switching in the output waveform. The driving device does not create a continuous representation of the signal, but rather it remains fixed at certain well-defined and discrete levels. While there may be as few as two, more typically there are three levels, each level enabled for variable time intervals such that the average value of the discrete signal is the desired output signal. A low-pass filter accepting the discrete levels at the variable times performs such an averaging operation and its output is sent to the transducer.

As is known in the art, the use of a third level results in quantizing an audio signal into three levels rather than two and allows for less error in the averaging of the available voltage levels; this reduces noise due to the quantization of an analog signal. As is also known, as long as the zero voltage level is driven for a period far shorter than the time constant of the inductive load, it will only have a transient effect on the load and not a steady state impact, and thus will not drain energy from the inductor.

As is also known in the art, the value of this known approach is significant. When a class D driver is used the switches that create the discrete output levels are either "on" or "off." When a switch is "on," a current flows but creates only a very small voltage across the switch, which is designed to have a low on-resistance (or drain-source resistance in a transistor used as a switch), and thus very little power is dissipated. When a switch is "off," no current at all flows in the switch, and thus no power is dissipated. Thus, essentially no power (or, more accurately, only a very small amount of power) is dissipated in creating the discrete drive levels.

If the filter used to convert the discrete levels to the continuous signal is built using inductors and capacitors, no power will be dissipated in the filter as neither of these elements dissipates power (due to the phase shift of current/voltage in these reactive elements). Consequently, in the known approach, a switching driver and reactive filtering results in nominally zero power dissipation in the driver and thus approaches 100% efficiency in delivering power to the load, i.e. in driving the transducer. As above, this improves battery life and results in significant commercial demand for such drivers.

In certain cases, the transducer itself may function as the reactive low-pass filter. For example, it is noted that a common loudspeaker constructed as a coil and magnet device has an inherent frequency limit, as it functions as a low-pass filter without any additional components. To the extent that the filter action is due to reactive components and not resistive elements, the transducer will both filter without power loss and transduce at the same time. This has resulted in what are described as "inductor-less" class D drivers, drivers that consist of the switching arrangement only, with the switching waveforms being delivered directly to the transducer having the inherent low-pass characteristic.

As in the known art, to recover the back-EMF signal with the present approach the current flow in the transducer is measured while the class D driver is operating. In addition, the hybrid action of an analog circuit, and the known art echo cancellation, is used to then remove the residual outgoing signal.

One aspect of the present approach is that class D drivers are designed to not generate a voltage due to current flow in the transducer, as that would imply unwanted power dissipation. Therefore, any attempt to measure current flow by, for example, measuring the small voltage that will be present across the switching device is counterproductive, as technology advances intend to make that switch resistance as close to zero as possible which leaves the "voltage across the switch" method of the known art unworkable.

However, another aspect of a viable class D driver is the reactive filter, whether that is explicit by the use of inductors and capacitors, or implicit in the transducer as in the "inductor-less" designs. This reactive filter action can be used to enable the present approach. Specifically, if the transducer is momentarily disconnected from any driving voltage, current will continue to flow in the transducer due to this reactive filter; this "flywheel" current, as it is sometimes called, will be of an amplitude equal to the last instantaneous value of the current through the load because the inductive part of the filter action prevents a discontinuous change in current.

Further, while it may seem somewhat counter-intuitive, no power is lost (in principle, assuming zero ohm on-resistance, etc.) if the transducer is momentarily shorted out. The shorting-out process corresponds to a switch state of zero volts across the load. That is, the switch states of a bridge of switches may include a zero voltage state; this has no impact on the power dissipation feature of a class D driver, as a shorted-out state also dissipates no power.

The presence of a zero-voltage state affects only the maximum power the bridge can deliver, but not its efficiency. For example, if the shorted-out state does not exist, a given bridge executing its switching sequence might deliver 1 Watt (W) into the transducer and the efficiency might be 90%. Imposing a shorted-out period of 1% of the duty cycle into the bridge switching sequence does not necessarily affect efficiency at all; efficiency may remain at 90%, but the power delivered will be reduced from 1 W to 0.99 W. If the shorted-out switches have the same on-resistance as the other switches in the bridge, the efficiency will not change at all. On the other hand, and perhaps counter-intuitively, if the shorted-out switches have a lower on-resistance than the other switches the efficiency may actually increase, but the maximum power delivered will drop.

Figure 1:
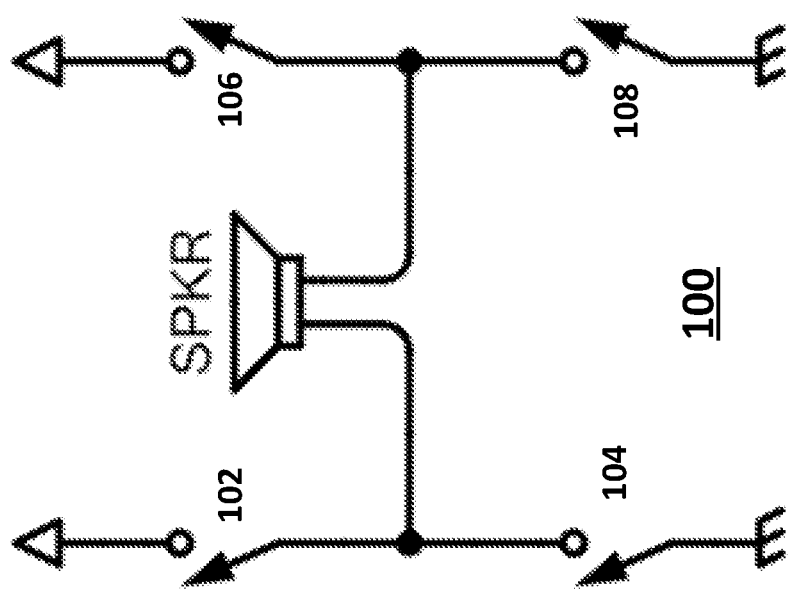
FIG. 1 is a diagram of a circuit comprising a typical transducer connected in a bridge of four switches as is known in the prior art.

FIG. 1 is a diagram of circuit 100 comprising a typical transducer, in this case a loudspeaker SPKR, connected in a bridge of four switches according to the prior art. In the simplest case, the switches are activated such that switches 102 and 108 at the top left and bottom right are closed, i.e., on, while switches 104 and 106 at the bottom left and top right are open, i.e., off. This applies a bridge voltage +V across transducer SPKR from left to right.

The switches then all change position, such that switches 102 and 108 are open or off, and switches 104 and 106 are closed or on. Now the voltage across the transducer is applied from right to left, resulting in a voltage of −V. In this way, the voltage ±V is driven across the transducer. As is known in the art, a third voltage level of zero may also be implemented by, for example, having switches 104 and 106 open or on, while switches 102 and 106 are closed or off (or vice versa), thus "shorting" the transducer and resulting in zero voltage across the transducer. The time spent at the voltage +V compared to −V (and at zero in the case of three levels) is controlled such that the average voltage across the transducer is the desired output value.

One of skill in the art will appreciate that it is implied in FIG. 1 that the transducer, i.e., loudspeaker, SPKR, has an inherent filter action, making circuit 100 an inductor-less class D device.

As seen in the following embodiments, in the present approach, while a zero-voltage state is created in the transducer, an additional bridge across the transducer creates a "signal capture circuit" that allows the current flow in the transducer to be measured, and thus the back-EMF signal to be extracted. While use of a zero voltage level is known in the art as above, measuring the back-EMF signal during a zero voltage state to create a full duplex equivalent mode as in the present approach has not been done before.

FIG. 2 is a diagram of a circuit 200 comprising a typical transducer connected in a bridge of four switches with an additional switch to create the additional bridge across the transducer according to one embodiment of the present approach. Circuit 200 is similar to circuit 100 of FIG. 1 but adds a switch S1 that is connected to both sides of the transducer. When switch S1 is closed as shown in FIG. 2, and switches 102, 104, 106 and 108 are open, the additional bridge is connected across the transducer while the switching amplifier is disconnected from the transducer. While the additional bridge is connected, a current will flow in switch S1 as the reactive filter action of the transducer tries to prevent any change in current (i.e., the "flywheel current" discussed above). Thus, when switch S1 is closed, the bridge containing switch S1 can be used as a signal capture circuit in which the signal across the transducer, which contains both the output signal sent to the transducer and the back-EMF signal created by the transducer, can be detected and measured.

It will be appreciated by reference to FIG. 1, the power dissipated during operation of circuit 100 as described above is due to current flowing in the two switches that are closed at each given moment in time. The same power dissipation will occur in circuit 200 when the transducer is being driven by an input signal. In addition, power will be dissipated when the transducer is shorted out by switch S1, as current will flow through S1 during this period of time.

The power dissipated in each phase is proportional to their duration. If the switch S1 is active only 1% of the time, then its power dissipation occurs for only 1% of the time. This fact can be exploited to significantly increase the on-resistance of the signal capture circuit, i.e., the S1 shorting path without having much impact on the efficiency.

In a typical example, the transducer may have a resistance of 8 ohms, while the on-resistance of each switch may be 0.1 ohm. Thus, in principle, a small amount of power is not used to reproduce sound in the transducer, but is dissipated as it is consumed in the two switches that are on; the theoretical efficiency is 1−(0.2 ohms/8 ohms) or 97.5%. (In practice there are small losses due to the finite time the switches take to change and the current that must be consumed to turn the switches on and off, but these are not significant for this calculation.)

Assume switch S1 has an on-resistance of 8 ohms, i.e., the same as the transducer, rather than the 0.1 ohm on-resistance of the other switches. As above, if switch S1 is only active 1% of the time, the average impedance over time is the impedance of the other switches for 99% of the time plus the impedance of switch S1 for 1% of the time, i.e., (0.2*99/100)+8/100, or 0.28 ohms. This results in 96.5% efficiency, a drop of only 1% from the efficiency of circuit 100 of FIG. 100 that has no switch S1. Thus, the departure from the expected efficiency and minimal power dissipation of a typical class D driver is minimal if the short periods of time during which measurements are made total only a small portion of the time of operation of the transducer. One of skill in the art will appreciate that a higher resistance in the shorting loop may be used with only a small loss in efficiency as long as the sensing time period is short relative to the normal operation time period, and will be able to select an appropriate resistance and sensing time period for a desired application.

As is known in the art, in producing audio output from a switching amplifier, the switching rate of the amplifier must significantly exceed the audio component frequency or frequencies, so that there is sufficient time to assess the average voltage output required to create the equivalent output of the switching amplifier. As an absolute minimum, the amplifier must be switching at twice the maximum audio frequency, although in practice the bridge switching frequency is usually 8 or 16 or more times higher than the maximum audio frequency.

Figure 3:
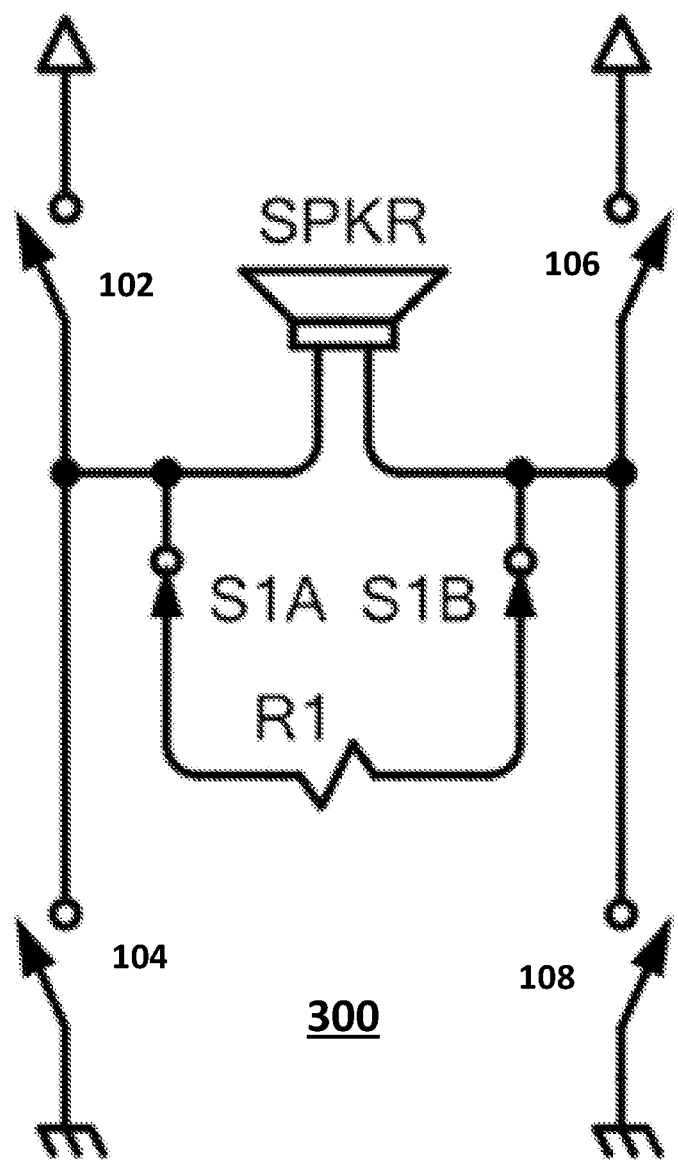
FIG. 3 is a diagram of a typical transducer connected in a bridge of four switches with additional switches to short the transducer according to another embodiment of the present approach.

FIG. 3 illustrates one way, according to one embodiment of the present approach, of making a circuit in which switch S1 of circuit 200 has a greater effective on-resistance, by making the resistance explicit. Circuit 300 comprises a typical transducer connected in a bridge of four switches, but with two additional switches S1A and S1B and a resistor R1 forming a signal capture circuit to bridge the transducer rather than the single switch S1 in circuit 200 of FIG. 2. If switches S1A and S1B have a low on-resistance of 0.1 ohm as the other switches, resistor R1 may have a resistance of 7.8 ohms to make the on-resistance of the shorted-out state a total of 8 ohms.

Figure 4:
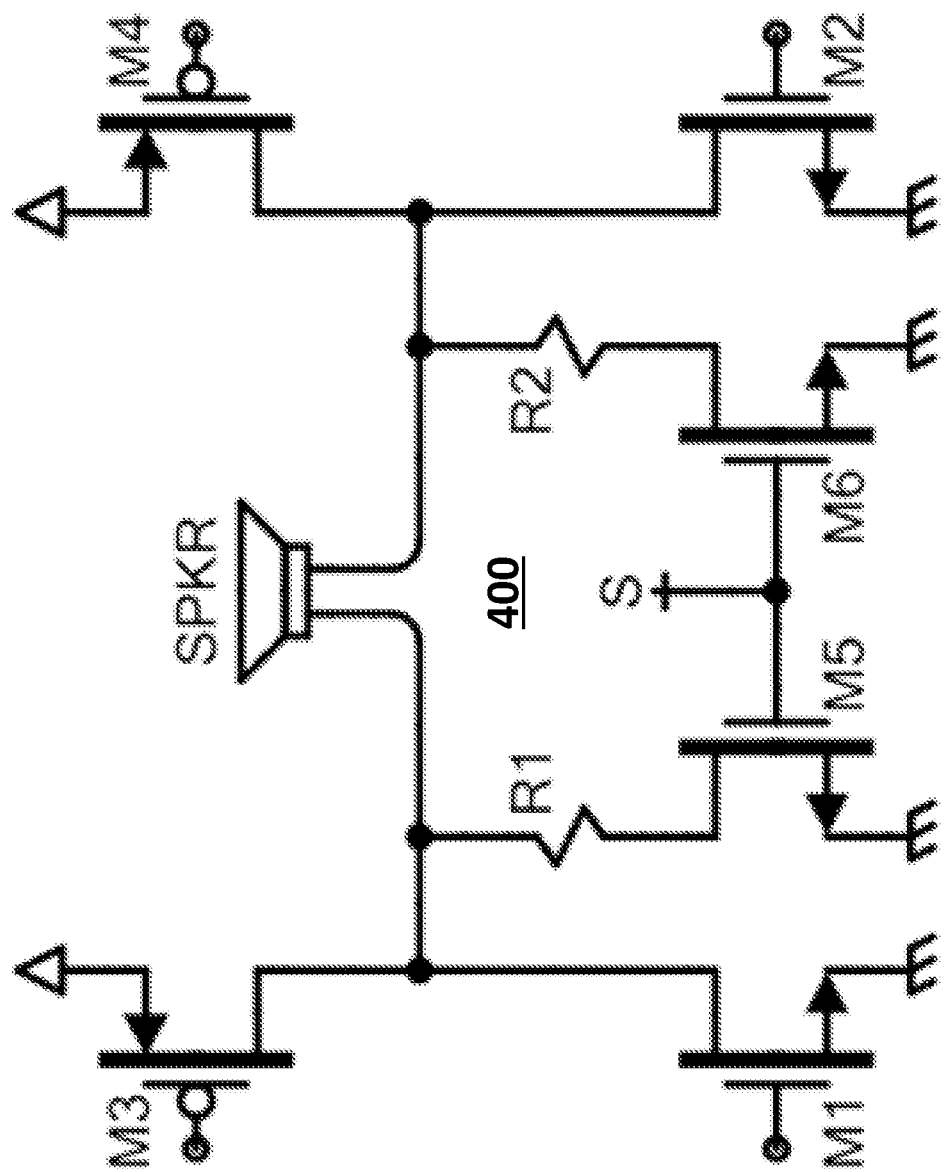
FIG. 4 is a diagram of a circuit comprising a typical transducer as it might be connected to a switching amplifier in a bridge configuration with additional switches to short the transducer according to an embodiment of the present approach.

FIG. 4 is a diagram of a circuit comprising a typical transducer as it might be connected to a switching amplifier in a bridge configuration with additional switches to short the transducer according to an embodiment of the present approach using PMOS and NMOS transistors as switches. In normal operation, i.e., the non-sensing phase, transistors M1 to M4 are driven as is known in the art to make a class D driver to a reactive filter transducer, here a loudspeaker SPKR. Transistors M1 to M4 operate as switches 102 to 108 as in FIGS. 1 through 3 above.

In circuit 400, the signal capture circuit contains transistors M5 and M6 and resistors R1 and R2. According to the present approach, circuit 400 enters the sensing phase when the switching amplifier is in a zero voltage state, i.e., providing zero voltage to the transducer. The transistors M5 and M6 are activated with the common control signal 'S' and transistors M1 and M2, which would otherwise be on during the zero voltage state, are turned off. Current continues to flow through resistors R1 and R2 and transistors M5 and M6 due to the reactive nature of the transducer. To achieve an effective on-resistance of 8 ohms for the sensing mode, resistors R1 and R2 may be, for example, nominally 3.5 ohms each and transistors M5 and M6 may have an on-resistance of 0.5 ohms each. (In theory, the current due to the back-EMF signal flows in transistors M1 and M2 during normal operation, but cannot effectively be measured due to the transistors' low resistance of about 0.5 ohm each; the 8 ohm resistance of the signal capture circuit allows the back-EMF to be measured.)

The voltage across the transducer is a measure of the current flowing through the transducer at the moment the sensing phase is activated; the relationship between current and voltage is based upon the combined resistance of resistors R1 and R2 and transistors M5 and M6. The voltage is centered at ground; one side of the transducer goes positive the other side goes negative. For this reason, in practice the voltages at the drains of transistors M1 and M2 are momentarily driven negative.

The voltage across the transducer during this measurement time includes both the output signal applied to the transducer and the back-EMF signal, and when the signal capture circuit is connected it thus generates the output signal and the back-EMF signal. As above, the back EMF is very small relative to the drive signal. Thus, as above a prediction of the signal current is used to form the hybrid action that allows for practical detection of the back-EMF signal. Again, since the signal capture circuit operates in a zero voltage state and only during a zero voltage state of the switching amplifier, the transducer produces an output that is no different than the output it would produce in response to the signal the switching amplifier is generating while the transducer generates the back-EMF signal. Thus, the transducer operates in an equivalent full duplex mode as explained above.

Figure 5:
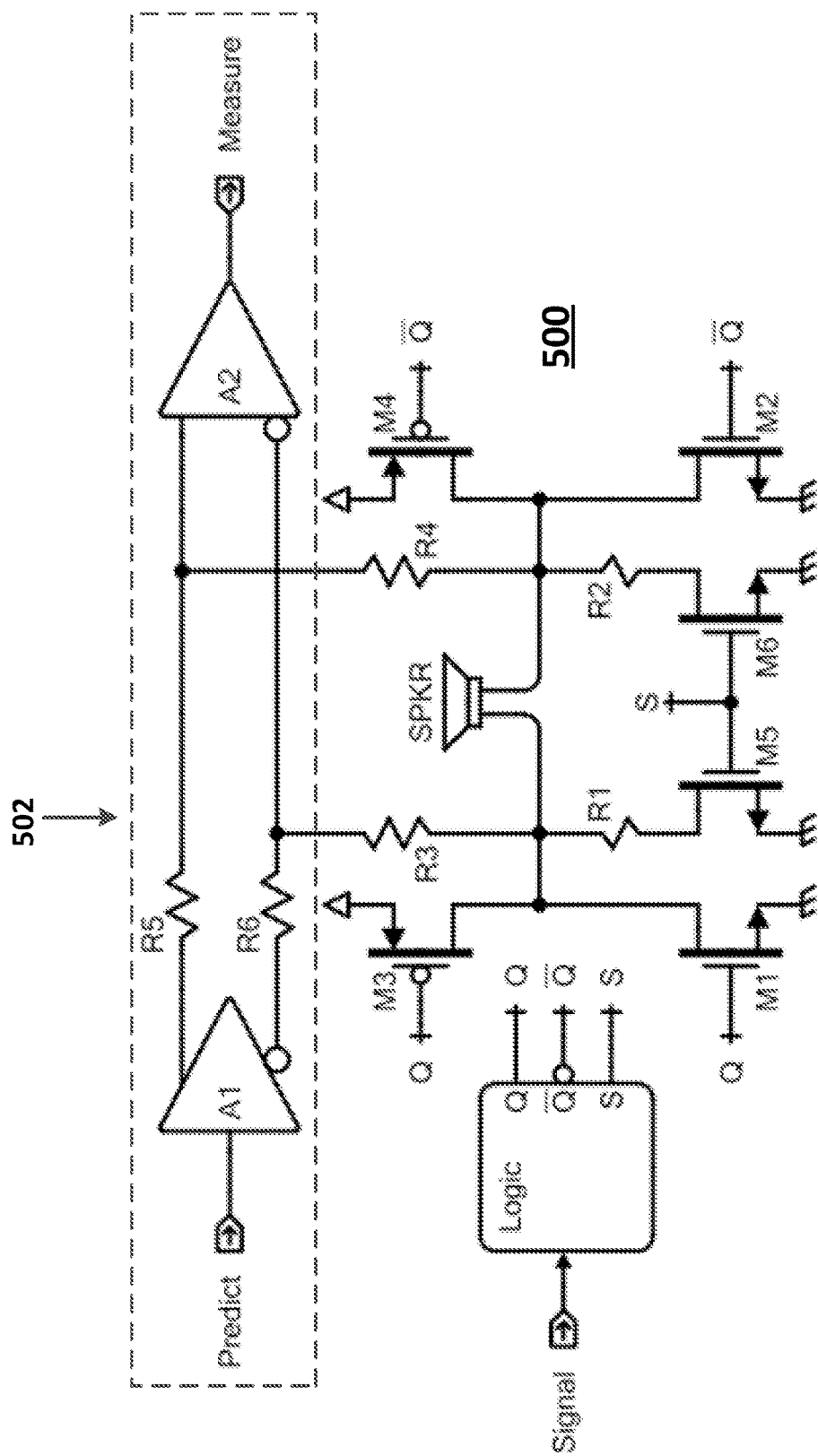
FIG. 5 is a diagram of a circuit comprising a typical transducer as it might be connected to a switching amplifier in a bridge configuration with additional switches to short the transducer according to another embodiment of the present approach.

FIG. 5 is a diagram of a circuit 500 comprising a typical transducer as it might be connected to a switching amplifier in a bridge configuration with additional switches to connect a signal capture circuit across the transducer according to another embodiment of the present approach in which a prediction of the signal current is used to allow measurement of the back-EMF signal. The means of driving the circuit 500 is well known and shown schematically as the box 'Logic' that accepts an input signal and drives the gates of the switching transistors. The driving means Logic includes a signal S that activates the measurement phase. During this time, the input Predict attempts to cancel the current signal that will appear across the transducer as described. The effectiveness of that prediction is monitored by element A2 that measures the difference between the prediction and the actual measured current.

The signal capture circuit again contains transistors M5 and M6 and resistors R1 and R2. When audio is playing, transistors M1 and M2 are on, and the voltage across the transducer reflects the output signal it receives as well as any back-EMF signal created by external sound. When the measurement phase is entered during a zero voltage state, transistors M1 and M2 are turned off and transistors M5 and M6 are turned on by signal S, connecting the signal capture circuit to the transducer. The voltage that was across the transducer will then cause current to flow in resistors R1 and R2 due to the inductive effect of the transducer. The current flowing in the measurement will also have the back-EMF signal imposed upon it.

As above, the output signal to the transducer will be too many times larger than the back-EMF signal for currently available ADCs to be able to isolate the back-EMF signal with an acceptable S/N ratio. Further, the full range of the output signal is so great that the ADC will be saturated and will clip. Also as above, an output audio signal may have a voltage of 100 mV, while a typical ADC may have a full-scale range of only about 10 mV. Thus, it is desirable to limit the range of the signal to allow the ADC to operate correctly.

Resistors R3 and R4 are of equal resistance to each other, and pass the current that is sensed from the transducer by the signal capture circuit to a subcircuit 502 that contains amplifiers A1 and A2 and resistors R5 and R6. Resistors R5 and R6 are also of equal resistance to each other, and generally expected to be of greater resistance than R3 and R4, in some cases by a factor of 10, although this may vary with the expected voltage of the signal from the transducer.

The subcircuit 502 acts to subtract a signal from amplifier A1 from the current sensed from the transducer. As indicated by the signal "Predict," amplifier A1 is driven by a signal that is a prediction of the audio output signal that drives the transducer. When this prediction signal is subtracted from the signal from the transducer, the signal to a high-gain amplifier A2 is significantly reduced, similar to echo cancellation.

One of skill in the art will appreciate that various prediction algorithms may be used. A standard algorithm is known as LMSFIR, since it uses a finite impulse response (FIR) filter, with the taps of the filter adjusted to provide a least mean square (LMS) value of the signal being processed. One of skill in the art will also appreciate that subcircuit 502 may be added to the embodiments shown in circuits 200, 300 and 400 of FIGS. 2, 3 and 4, respectively, if desired.

One of skill in the art will also appreciate that the period of time over which echo cancellation is desired largely determines how effective the echo cancellation can be. For example, many prior art instances require that the echo cancellation be effective over a period of several seconds. Telephone calls typically require the ability to cancel echoes over several seconds. Similarly, the echo or noise cancellation in some headphones operates over several seconds and is thus able to reduce the noise or echo to about 1 part in 30.

The present approach has a large advantage in this respect in that the period of time over which the echo cancellation is used is very short, expected to be on the order of a few microseconds. This allows the output audio portion of the signal output by amplifier A2 to be driven toward zero, reduced to about 1 part in 1000, or 60 dB; the back-EMF signal is not reduced by the Prediction signal and remains in the output of amplifier A2. The goal is to remove enough of the output signal so that amplifier A2 can use its full linear range, again typically about 10 mV, to produce the reduced output signal and the back-EMF signal without clipping.

At this point, an ADC of sufficient capability, for example, one that can treat signals separated by 100 dB, can process the output of amplifier A2 to retrieve the back-EMF signal. Additionally, conventional echo cancellation can be applied to further remove the output signal while leaving the back-EMF signal for further processing.

Figure 6:
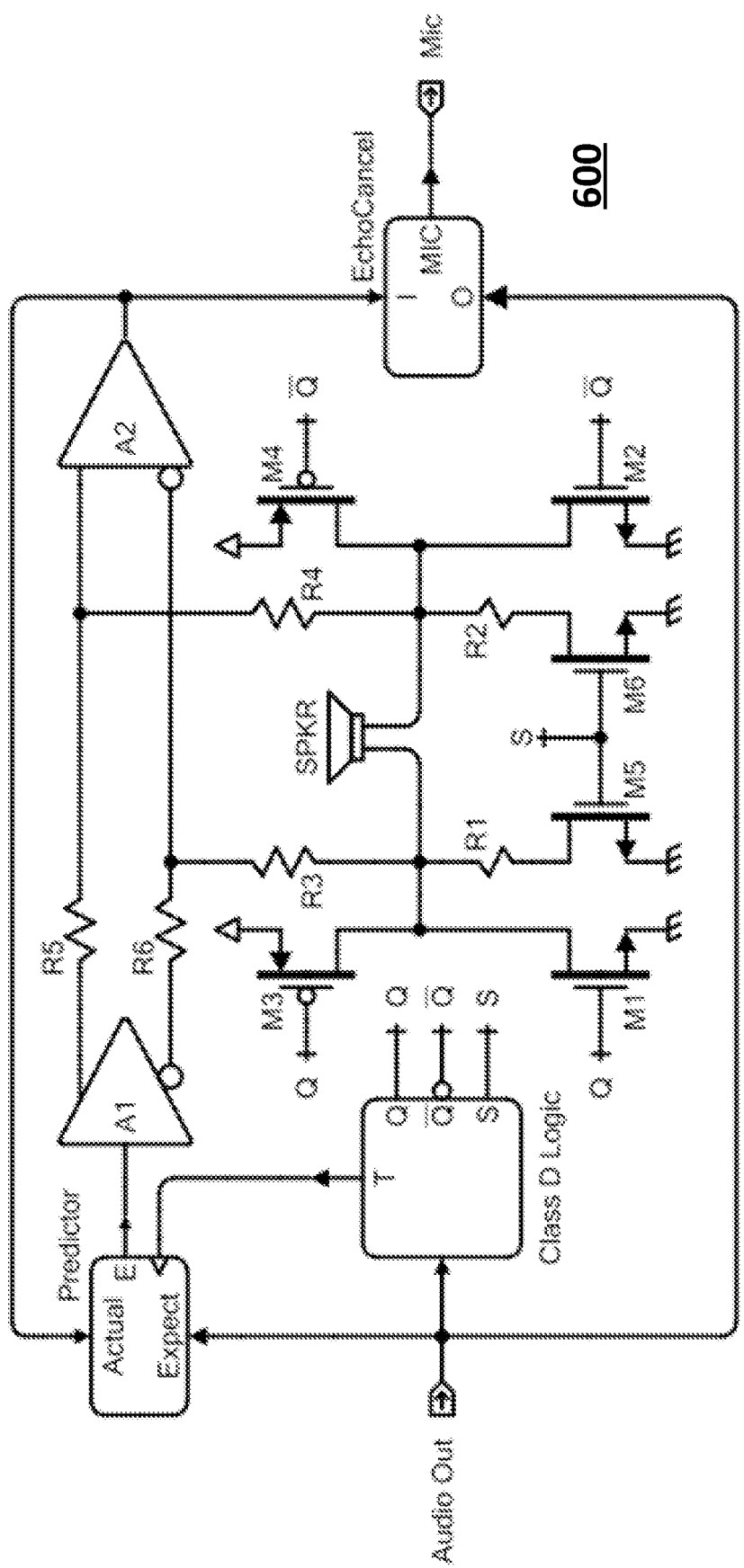
FIG. 6 is a diagram of a circuit comprising a typical transducer as it might be connected to a switching amplifier in a bridge configuration with additional switches to short the transducer according to yet another embodiment of the present approach.

FIG. 6 is a diagram of a circuit 600 comprising a typical transducer as it might be connected to a switching amplifier in a bridge configuration with additional switches to connect a signal capture circuit to the transducer according to another embodiment of the present approach in which a prediction of the signal current is used to allow measurement of the back-EMF signal. In circuit 600 the Logic component shown in circuit 500 of FIG. 5 is integrated into a complete system that may be used in an audio application.

In circuit 600, the switching amplifier is driven by a logic circuit here labeled Class D Logic, that provides signals Q and Q-bar to drive transistors M1 to M4 for normal operation in which the transducer produces audio based upon the audio output signal Out. The logic circuit also provides signal S to cause the transducer to be connected to the signal capture circuit containing transistors M5 and M6 and resistors R1 and R2.

Circuit 600 also contains a prediction loop that tends to drive the measurement of the current received from the transducer loop to zero at the appropriate time, i.e., when the measurement phase is active. A signal T indicates when the measurement phase occurs (the rest of the time, the output of amplifier A2 is meaningless). A logic circuit Predictor compares the output audio signal to the output of amplifier A2 and generates a signal to amplifier A1 that is the signal shown as Predict in FIG. 5. In this way, the prediction loop removes, to a large degree, the component of the measured signal from the transducer that is predictable from the applied output audio signal.

The signals S and T are nearly simultaneous and thus may be considered the same signal, although in some embodiments they may differ slightly. For example, if the sampling period is 100 nS in one embodiment, the signal T may have a positive edge at about 50 nS into that 100 nS period so as to cause the prediction loop to perform the comparison of the measured signal to the applied output signal.

As above, the residue may then be processed, or may be passed to a known art echo canceller that completes the task of removing the outgoing signal leaving only the back-EMF signal, i.e., a signal resulting from external sound acting with the microphone action of the transducer.

A microphone MIC is shown in FIG. 6, but is not required in the present approach; rather, it is shown to indicate that the output of amplifier A2, which contains the back-EMF signal, may be seen by an audio system as the same type of a signal that would be generated by a microphone. The signal from amplifier A2 may then be further processed as described above, i.e., conventional echo cancellation may be performed on the signal, the signal may be fed to an ADC, etc.

Figure 7:
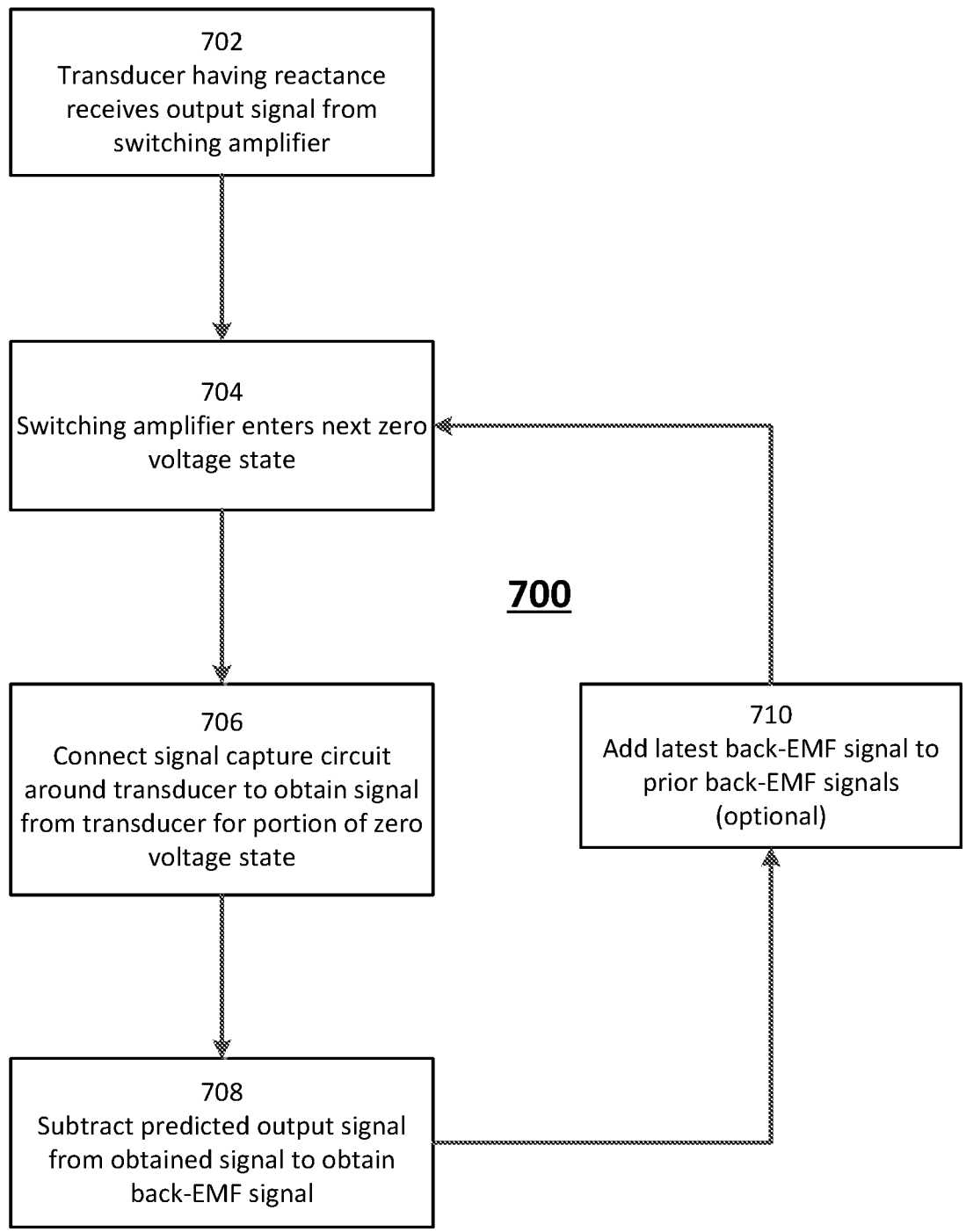
FIG. 7 is a flowchart of a method of determining a signal representative of the effect of external sound on a transducer being driven by a switching amplifier according to one embodiment of the present approach.

FIG. 7 is a flowchart of a method of determining a signal representative of the effect of external sound on a transducer being driven by a switching amplifier according to one embodiment of the present approach.

At step 702, the transducer is driven in its normal fashion, receiving an output signal from a switching amplifier. In the example above, a loudspeaker or earbud is driven with an audio signal and produces sound. In the circuits 400, 500 and 600 of FIGS. 4, 5 and 6, respectively, transistors M1 to M4 are appropriately switched on and off to drive the loudspeaker to produce sound corresponding to the audio output signal.

At step 704, the switching amplifier enters a zero voltage state in which the voltage across the transducer is zero. In the circuits above, for example, transistors M1 and M2 may be on while transistors M3 and M4 are off.

At step 706, transistors M1 and M2 are turned off for a portion of the nominal time of the zero voltage state while transistors M5 and M6 are turned on, whereby the signal capture circuit around the transducer is connected and receives the current created by the reactance of the transducer. In the circuits above, current from the loudspeaker flows through the briefly increased impedance of the signal capture circuit containing transistors M5 and M6 and through resistors R1 and R2, rather than through the very low impedance of transistors M1 and M2. As above, this current represents both the output signal that was sent to the loudspeaker, as well as a back-EMF signal representing the effect of external sound on the loudspeaker. As above, it is desirable that the short periods of time during which measurements are made total only a small portion of the time of operation of the transducer so that the efficiency of the system is not significantly affected.

At step 708, a prediction of the output signal is subtracted from the signal represented by the current that was obtained from the transducer in the signal capture circuit, so that the portion of the current from the signal capture circuit that is due to the output signal is either greatly reduced or eliminated. This is accomplished in circuits 500 and 600 of FIGS. 5 and 6 above by the subcircuit consisting of amplifiers A1 and A2 and resistors R5 and R6 (and again may be added to circuits 200, 300 or 400 of FIGS. 2, 3, and 4, respectively). As a result, the back-EMF signal is at least much larger relative to the output signal in the resulting signal, and in some cases may be the only signal remaining.

In some embodiments, a sequence of such back-EMF signals may optionally be acquired. In such an embodiment, the process returns to steps 704 to 708; each time the process repeats another back-EMF signal is captured during a zero voltage state of the switching amplifier. In some embodiments, multiple back-EMF signals may be acquired during a single zero voltage state, while in other embodiments they may be acquired in successive zero voltage states, at periodic timed intervals (i.e., in zero voltage states close to such intervals), or even randomly, depending upon the particular event for which a back-EMF signal is to be acquired. The succession of back-EMF signals may be concatenated, thereby generating a longer back-EMF signal, which may again be further processed. One of skill in the art will appreciate that in the case of audio there must be a sufficient rate and number of instances of the zero voltage state to measure the back-EMF to a frequency at least equal to the maximum audio frequency.

For example, in one embodiment each zero voltage state (and the ±V states) of a switching amplifier might be 1 microsecond (uS). If the sampling interval is sufficiently shorter than 1 uS, there will be ample time to disconnect the switching amplifier during the zero voltage state. Thus, a sampling period of 100 nanoseconds (nS) might be used during the 1 uS zero voltage state in such a case. One of skill in the art will appreciate that other durations of the zero voltage state of the switching amplifier and of the sampling period are possible.

As above, the signal capture circuit operates in a zero voltage state and only during a zero voltage state of the switching amplifier, so that the transducer produces an output that is no different than the output it would produce in response to the signal the switching amplifier is generating while the transducer generates the back-EMF signal. Thus, the transducer operates in an equivalent full duplex mode as described above. Regardless of whether any of the output signal remains in the recovered signal along with the back-EMF signal, the resulting signal may now in some implementations be fed to an ADC for processing, or in other implementations may be further subjected to conventional echo cancellation.

By combining these features, it is possible to operate a transducer driven by a switching amplifier in a full duplex mode that allows both audio output and detection of external sound simultaneously.

As above, the present approach teaches how to measure the back-EMF when a discrete level, non-continuous class D or similar form of driver is used with a transducer having inductance, and has been described in the context of an audio transducer. The principle of operation is that the signal across a transducer, which is a state of nominally zero volts, is briefly interrupted during which a measurement is made of residual current flow due to the inductance of the transducer. That current flow is the "inductive" current in the transducer in the audio example.

However, it is to be understood in light of the teachings herein, that any transducer or load that results in a return of energy from storage can substitute for the described "inductive current." For example, if a piezoelectric crystal is deflected from its nominal state by the application of a voltage across it, when that voltage is removed the energy stored in the defection will dissipate by causing a current flow in whatever impedance is present in the zero voltage state. This current flow is like the inductive current from a transducer in that it has a component due to the amount of deflection recently applied and a component due to the environment. The environmental component (sound, vibration, etc.) is separable from the component due to the deflection in the same way as taught above.

Further, as described above, the discussion herein focuses primarily on sound, but use of the present approach is not limited to sound applications. In some embodiments, external or environmental events other than sound may be detected using the present approach, including some motion activities of a user, some biological functions (including a user's heart beat), pressure, temperature, humidity, and the application of a physical force.

One specific example of the potential use of the present approach in a non-audio case is in medical ultrasound imaging devices. A transducer such as a piezoelectric transducer or a CMUT (capacitive micromachined ultrasound transducer) is first driven by a pulse to cause a significant distortion. This distortion is coupled into a compression wave (i.e., a sound) that propagates in the patient and is reflected from various structures in the body. The same transducer is then used to receive the reflected signal. In the current art, without benefit of the present approach, the ultrasound device works only in half-duplex mode; first, it transmits the sound pulse, and it is then switched to a "listening mode" where the returned signal is detected. Using the present approach, the device could work full duplex, that is, it could send a continuous signal into the body and be able to measure the reflected signal while still sending a signal.

Another possible use of the present approach is in connection with piezoelectric or capacitive transducers used to replace wire-wound audio transducers. In these cases the returned mechanical energy of deflection substitutes for the described inductive current; the present approach can enable these forms of transducers to operate as full duplex microphones.

Motors of various kinds can also be substituted for the audio transducer described above. A motor that provides motion in a linear manner may be constructed very similarly to a loudspeaker having a coil and magnet and may also be affected by an environmental effect. Rather than being used to generate sound, the relative movement of a coil and magnet may represent a positioning control, for example, in the elements of a robot or numerically controlled machine device, or the focusing apparatus of a camera.

The benefit of the present approach in these motor cases may be a form of closed loop control; the approach to the desired position may be moderated or enhanced by the back EMF signal. For example, a lens positioning system in a camera may moved in an optimal way so as to reach a desired position rapidly, thereby reducing the delay time to focus. Similar considerations may apply to a robotic system, where in addition to reduced time to reach a certain set-point the back-EMF contains information on how strongly the linear motor of the robot is holding an object, thus preventing over-pressure when holding fragile objects.

A more conventional type of motor, a rotating device, that in some cases may be controlled by multiple phases as in a stepper motor or a three phase electric drive, may also benefit from the present approach. Currently, such rotation motors may use separate means (such as a separate winding) to pick up back-EMF. The present approach makes this unnecessary; the driving windings may be used. No separate means is needed, saving cost, power and physical space.

Using the present approach, the discrete level driver may be enabled to feed back to a controller the torque the motor is experiencing, and this may be used to optimize or protect its operation. While a stalled motor is easily detected for protection, a more subtle use of the invention is possible in which the back-EMF provided by the present approach is used as is known in the art, to control speed, shorten the time taken to reach a given position, etc. For example, a motor drive using the present approach in a winch could continuously measure the weight being lifted thus enhancing safety.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

What is claimed is:

1. A method of determining a signal representative of the effect of external sound on a transducer being driven by an output signal from a switching amplifier having a zero voltage state, the transducer having a reactance that causes a current to continue to flow momentarily in the transducer when the output signal ceases, comprising the steps of:
    disconnecting the transducer from the switching amplifier during an occurrence of the zero voltage state for a period of time shorter than a duration of the zero voltage state;
    connecting a signal capture circuit around the transducer and measuring a current in the signal capture circuit during the period of time in which the transducer is disconnected from the switching amplifier, thereby capturing a signal caused by the inductance of the transducer, the captured signal containing both the output signal and the signal representative of external sound;
    generating a modified captured signal containing the signal representative of external sound by removing a prediction of the output signal from the captured signal; and
    wherein connecting the signal capture circuit around the transducer during the periods in which measurements are made comprises connecting a resistance around the transducer by means of a switch.

2. The method of claim 1 wherein the period of time during which the transducer is disconnected from the switching amplifier is no greater than 10 percent of the duration of a zero voltage state.

3. The method of claim 1 wherein the transducer is a speaker.

4. The method of claim 1 wherein the switch comprises an NMOS transistor.

5. A method of determining a signal representative of the effect of external sound on a transducer being driven by an output signal from a switching amplifier having a zero voltage state, the transducer having a reactance that causes a current to continue to flow momentarily in the transducer when the output signal ceases, comprising the steps of:
    disconnecting the transducer from the switching amplifier during an occurrence of the zero voltage state for a period of time shorter than a duration of the zero voltage state;
    connecting a signal capture circuit around the transducer and measuring a current in the signal capture circuit during the period of time in which the transducer is disconnected from the switching amplifier, thereby capturing a signal caused by the inductance of the transducer, the captured signal containing both the output signal and the signal representative of external sound;
    generating a modified captured signal containing the signal representative of external sound by removing a prediction of the output signal from the captured signal; and
    wherein the transducer is a piezoelectric crystal.

6. A method of determining a signal representative of the effect of external sound on a transducer being driven by an output signal from a switching amplifier having a zero voltage state, the transducer having a reactance that causes a current to continue to flow momentarily in the transducer when the output signal ceases, comprising the steps of:
    disconnecting the transducer from the switching amplifier during an occurrence of the zero voltage state for a period of time shorter than a duration of the zero voltage state;
    connecting a signal capture circuit around the transducer and measuring a current in the signal capture circuit during the period of time in which the transducer is disconnected from the switching amplifier, thereby capturing a signal caused by the inductance of the transducer, the captured signal containing both the output signal and the signal representative of external sound;
    generating a modified captured signal containing the signal representative of external sound by removing a prediction of the output signal from the captured signal; and
    further comprising:
    repeating the steps of disconnecting the transducer from the switching amplifier, connecting a signal capture circuit and measuring a current in the signal capture circuit, and generating a modified captured signal, thereby generating an additional modified captured signal; and linking the additional modified captured signal in series with the modified captured signal, thereby generating a longer signal representative of external sound.

7. A method of determining a signal representative of an effect of an environmental event on a motor being driven by an output signal from a switching amplifier having a zero voltage state, the motor having a reactance that causes a current to continue to flow momentarily in the motor when the output signal ceases, comprising the steps of:

disconnecting the motor from the switching amplifier during an occurrence of the zero voltage state for a periods of time shorter than a duration of the zero voltage state;

connecting a signal capture circuit around the motor and measuring a current in the signal capture circuit during the period of time in which the transducer is disconnected from the switching amplifier, thereby capturing a signal caused by the inductance of the motor, the captured signal containing both the output signal and the signal representative of the environmental event;

generating a modified captured signal containing the signal representative of the environmental event by removing a prediction of the output signal from the captured signal; and wherein connecting the signal capture circuit around the motor during the periods in which measurements are made comprises connecting a resistance around the motor by means of a switch.

8. The method of claim 7 wherein the switch comprises an NMOS transistor.

9. The method of claim 7 wherein the environmental event is the torque being experienced by the motor.

10. The method of claim 7 wherein the environmental event is the force being exerted on an object by the motor.

11. The method of claim 7 wherein the environmental event is the speed at which an object is moved by the motor.

12. A circuit for determining a signal representative of the effect of external sound on a transducer being driven by a current representing an output signal from a switching amplifier, the switching amplifier having a zero voltage state and comprising one or more switches each having two states, a first state configured to allow current to flow to the transducer and a second state configured to prevent current from flowing to the transducer, and the transducer having a reactance that causes a current to continue to flow momentarily in the transducer when the driving current ceases, the circuit comprising:

a signal capture circuit configured to capture a signal caused by the inductance of the transducer and having a first end configured to be connected to a first end of the transducer and a second end configured to be connected to a second end of the transducer;

control logic configured to generate a first switching signal causing the states of the one or more switches in the switching amplifier to change during a portion of a zero voltage state, thereby preventing current from flowing from the switching amplifier to the transducer, and a second switching signal causing the signal capture circuit to be connected to the transducer for the portion of the zero voltage state;

a comparison circuit configured to receive the captured signal and a prediction of the output signal and to generate a modified captured signal containing the signal representative of external sound by removing the prediction of the output signal from the captured signal.

13. The circuit of claim 12 wherein the signal capture circuit comprises a resistor in series with a switch, the switch configured to change between a first state configured to allow current to flow through the resistor and a second state configured to prevent current from flowing through the resistor in response to the second switching signal.

14. The circuit of claim 12 wherein the signal capture circuit comprises:

a first resistor having two ends, a first end connected to the first end of the transducer;

a first NMOS transistor having a drain, a source and a gate, the drain connected to the second end of the first resistor and the source connected to a ground, and the gate configured to receive the second switching signal;

a second resistor having two ends, a first end connected to the second end of the transducer; and a second NMOS transistor having a drain, a source and a gate, the drain connected to the second end of the second resistor, the source connected to a ground, and the gate connected to the gate of the first NMOS transistor.

15. A method of determining a signal representative of an effect of an environmental event on a transducer being driven by an output signal from a switching amplifier having a zero voltage state, the transducer having a reactance that causes a current to continue to flow momentarily in the transducer when the output signal ceases, comprising the steps of:

disconnecting the transducer from the switching amplifier during an occurrence of the zero voltage state for a period of time shorter than a duration of the zero voltage state;

connecting a signal capture circuit around the transducer and measuring a current in the signal capture circuit during the period of time in which the transducer is disconnected from the switching amplifier, thereby capturing a signal caused by the inductance of the transducer, the captured signal containing both the output signal and the signal representative of the environmental event;

generating a modified captured signal containing the signal representative of the environmental event by removing a prediction of the output signal from the captured signal; and wherein connecting the signal capture circuit around the transducer during the periods in which measurements are made comprises connecting a resistance around the transducer by means of a switch.

16. The method of claim 15 wherein the period of time during which the transducer is disconnected from the switching amplifier is no greater than 10 percent of the duration of a zero voltage state.

17. The method of claim 15 wherein the transducer is a speaker.

* * * * *